United States Patent [19]

Cronauer

[11] Patent Number: 5,291,143
[45] Date of Patent: Mar. 1, 1994

[54] MODULATOR WITH IMPROVED DAMPING

[75] Inventor: Edward A. Cronauer, Massapequa Park, N.Y.

[73] Assignee: United Technologies Corporation, Hartford, Conn.

[21] Appl. No.: 849,112

[22] Filed: Mar. 9, 1992

[51] Int. Cl.$^5$ .......................................... H03K 17/16
[52] U.S. Cl. ........................................ 328/65; 328/67
[58] Field of Search .................. 307/253, 268; 328/65, 328/67

[56] References Cited

U.S. PATENT DOCUMENTS

| | | | |
|---|---|---|---|
| 2,686,263 | 8/1954 | Konick | 328/67 |
| 3,320,491 | 5/1967 | Eckstein, Jr. | 328/67 |
| 3,328,703 | 6/1967 | Lee | 328/67 |
| 3,662,189 | 5/1972 | Robinson et al. | 328/67 |
| 4,150,307 | 4/1979 | Loucks | 307/284 |
| 4,371,830 | 2/1983 | Loucks | 323/265 |
| 4,684,821 | 8/1987 | Picone et al. | 307/106 |
| 4,803,378 | 2/1989 | Richardson | 307/108 |
| 4,812,686 | 3/1989 | Morse | 307/491 |

OTHER PUBLICATIONS

Radar Handbook, 2nd Ed., Pulse Modulators, by Merrill I. Skolnik, McGraw-Hill, 1990; pp. 4.32 through 4.39.
Radar Handbook, 1st Ed., Transmitters, by Merrill I. Skolnik, McGraw-Hill, 1970; pp. 7-68 through 7-87.
Introduction to Radar Systems, 2nd Ed., Modulators, by Merrill I. Skolnik, McGraw-Hill, 1980; pp. 214-216.

*Primary Examiner*—William L. Sikes
*Assistant Examiner*—Shawn Riley
*Attorney, Agent, or Firm*—Patrick J. O'Shea

[57] ABSTRACT

A modulator with improved damping comprises a charging network which limits the rate at which energy is transferred into a pulse forming network, and a switch to discharge the energy stored in the pulse forming network when the network has charged to a predetermined energy level. The pulse forming network discharges into the primary winding of a transformer which couples the energy to its secondary winding which routes the energy to an RF power generating tube. The modulator also includes an improved damping network which places a diode and resistor electrically in parallel with each other, and both in series with the switch to reduce the magnitude of the post-pulse voltage oscillations.

12 Claims, 4 Drawing Sheets

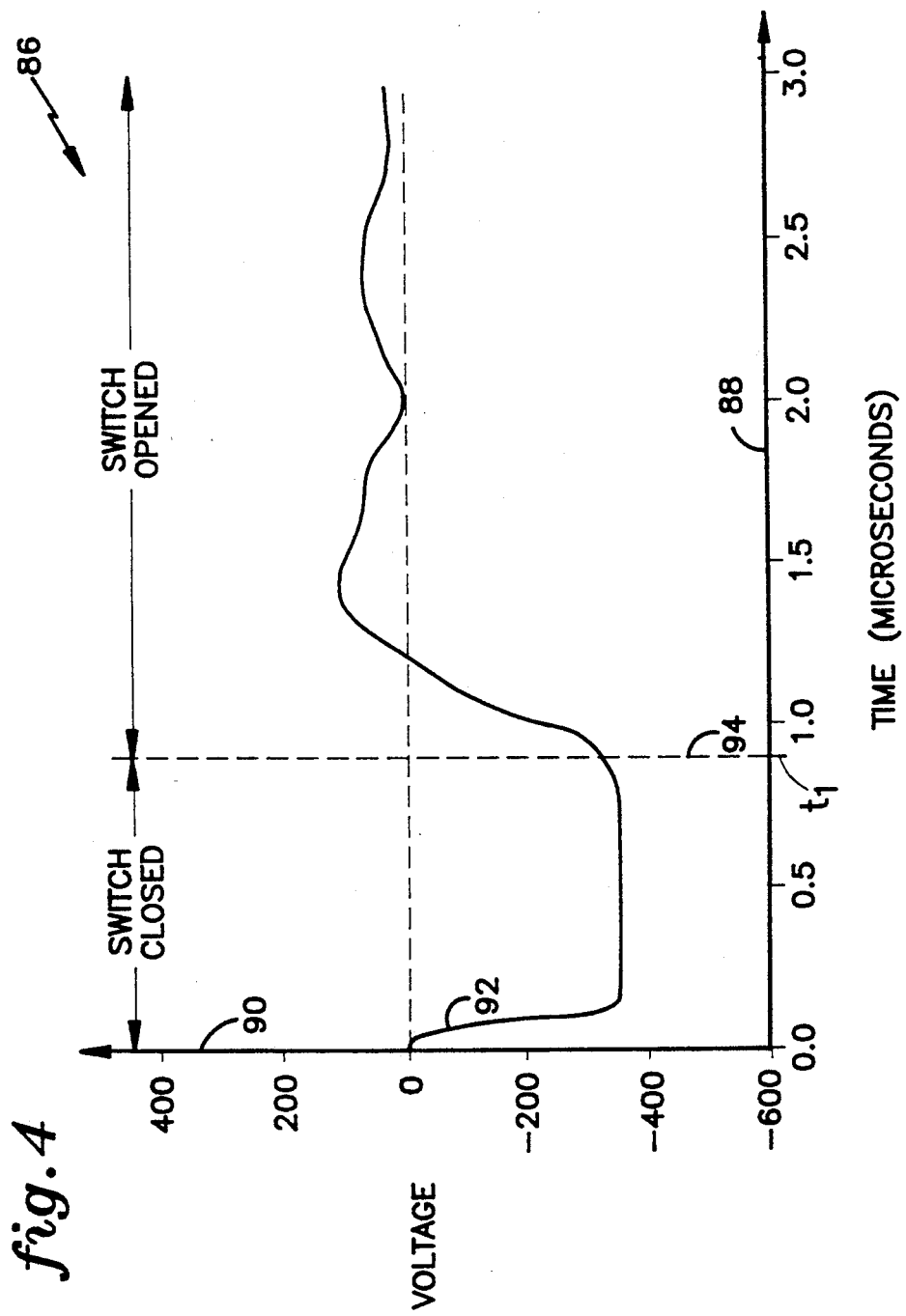

5,291,143

MODULATOR WITH IMPROVED DAMPING

DESCRIPTION

Technical Field

This invention relates to radar, and more particularly to modulators for radar transmitters.

Background Art

A radar system provides a pulse of electromagnetic energy, and measures the returned electro-magnetic energy to detect and locate objects. The pulse of transmitted electro-magnetic energy is formed in a radar transmitter which contains an RF power generating tube such as a magnetron or klystron. The RF tube generates electro-magnetic energy when it receives a pulse of electric power from a modulator. RF pulse width, shape, and repetition rate are therefore dependent on the modulator.

One popular modulator is a line type modulator which includes a pulse-forming network (PFN) that behaves like a transmission line. The PFN is continuously charged and discharged under the control of a switch to generate the shaped electrical power pulse to the RF tube. The switch (e.g., a gas tube, magnetic core or silicon-controlled rectifier) closes allowing the PFN to discharge into the RF tube through a pulse transformer. The switch then opens to allow the PFN to recharge from a DC power supply.

An example of a line-type modulator is disclosed in "RADAR HANDBOOK" by edited Merrill I. Skolnik (McGraw-Hill, Inc., 1970) on page 7-70. The modulator disclosed therein includes circuitry which provides backswing voltage damping and inverse voltage damping to discharge the residual energy stored in the inductors, capacitors and the PFN at the end of the main transmitted pulse. If the switch opens instantly at the end of the main power pulse and has negligible capacitance, the backswing and inverse circuits are very effective at damping the inverse voltage. However, due to imperfections in most switches (especially solid state and magnetic switches), backswing and inverse damping alone often do not provide sufficient damping, and therefore can not provide the desired, low magnitude post-pulse voltage oscillations.

DISCLOSURE OF THE INVENTION

An object of the present invention is to reduce the post-pulse voltage oscillations in the modulator after the desired electrical power pulse is delivered by the modulator.

According to the present invention an electrical charging network limits the rate at which energy is transferred from a power source into a pulse forming network (PFN), a switch triggers the discharge of energy stored in the PFN when the PFN has charged to a predetermined energy level, the PFN discharges into the primary winding of a transformer which couples the energy to its secondary winding which provides an electrical power pulse to an RF power tube that generates a pulse of transmitted electro-magnetic energy, an improved damping network having a diode and resistor electrically in parallel with each other and both in series with the switch is used to reduce the magnitude of the post-pulse voltage oscillations.

These and other objects, features and advantages of the present invention will become more apparent in light of the following detailed description of a best mode embodiment thereof as illustrated in the accompanying drawings.

BRIEF DESCRIPTION OF THE DRAWINGS

FIG. 4 is an illustration of the voltage applied across the RF tube versus time by the improved line type modulator of FIG. 3.

BEST MODE FOR CARRYING OUT THE INVENTION

Figure 1:
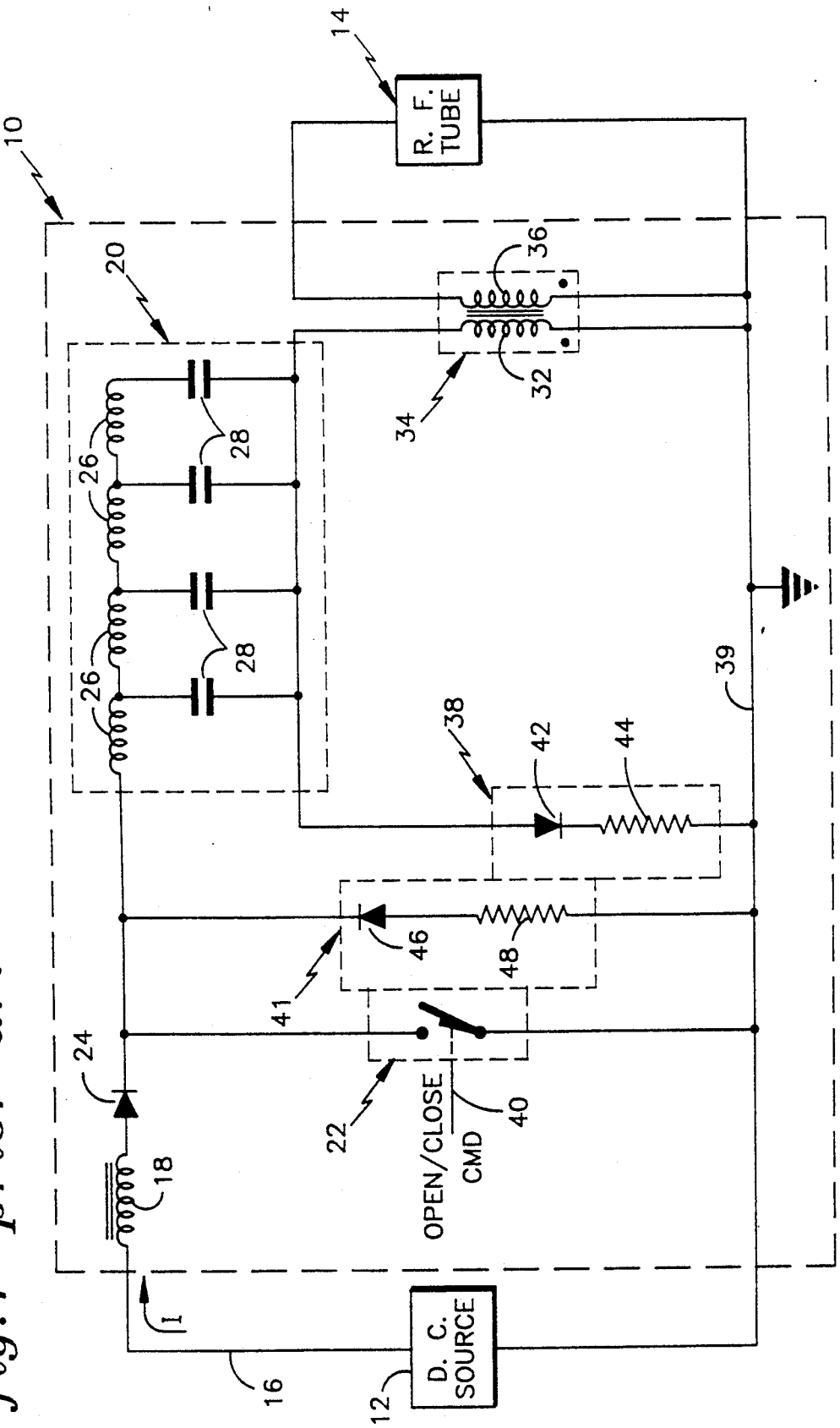
FIG. 1 is a schematic diagram of a prior art line type modulator.

Referring to FIG. 1, a prior art line type modulator 10 receives energy from a high voltage D.C. source 12, and applies the electrical energy to an RF tube 14 in a controlled manner which turns the tube 14 on and off to generate a pulse of electro-magnetic energy. The D.C. source 12 provides a current I on a line 16 into an inductor 18. The impedance value of the inductor 18 controls the rate energy is transferred from the D.C. source 12 into a pulse forming network (PFN) 20 while a switch 22 is in the open position. A hold-off diode 24 controls the flow of current when the PFN 20 is fully charged and the current I on the line 16 goes to zero. The cathode of the hold-off diode 24 is connected to the high side of the PFN 20 which includes a plurality of series inductors 26 and parallel capacitors 28 which combine to act like a transmission line. The low side of each of the plurality of capacitors 28 is connected to the high side of a primary winding 32 of a transformer 34. The transformer 34 also includes a secondary winding 36 having a high side which is connected to the RF tube 14. The low sides of the the primary winding 32 and the secondary winding 36 are both connected to a return line 39 at zero volts potential (i.e., ground).

Once the PFN has been completely charged, an open/close switch command signal on a line 40 commands the switch 22 to close, initiating the discharge of energy in the PFN 20. The energy in the PFN is transferred to the primary winding 32 of the transformer 34, where the energy is coupled to the secondary winding 36 and presented to the RF tube which generates the pulse of electro-magnetic energy. The shape and duration of the electrical pulse applied across the RF tube is determined primarily by the values of the inductors 26 and capacitors 28 in the PFN.

The sharpness of the voltage pulse's trailing edge depends on all the energy within the modulator's reactive elements (e.g., capacitors and inductors) being used up, as well as having closely matched impedance values between the RF tube 14 and the modulator 10. However, due to the nonlinear nature of the RF tube and the inherent stray circuit capacitances and inductances (not shown) in most electrical circuits, it is often difficult to dissipate all the energy left in the modulator components. Therefore, backswing and inverse damping (as discussed above) are required to achieve the desired pulse shape. Consequently, the modulator 10 also contains a backswing damping circuit 38 and an inverse damping circuit 41.

The backswing damping circuit 38 contains a diode 42 and a resistor 44 which dissipates residual energy held by the stray capacitances and inductances in the modulator, and the PFN. The inverse damping circuit 41 contains a diode 46 and resistor 48 which also dissipates residual energy so the charging voltage of the PFN for the next pulse will not be affected.

As the PFN and the stray capacitances and inductances (e.g., due to the RF tube and the transformer) are discharged, the magnitude of the post-pulse voltage oscillations must be held within reasonable limits, otherwise, the RF tube will produce ring noise which degrades the radar receiver's (not shown) performance after the main transmitted pulse. As discussed earlier, the backswing damping circuit 38 and inverse circuit 41 dissipate the residual energy within the PFN to reduce the magnitude of the backswing voltage. However, when switch 22 does not open quickly enough (which is often the case with solid state switches), these conventional damping circuits (38,41) alone do not provide sufficient attenuation of the post-pulse voltage oscillations to ensure the RF tube will not be errantly turned on. The problem is best illustrated with a plot of the RF tube voltage.

Figure 2:
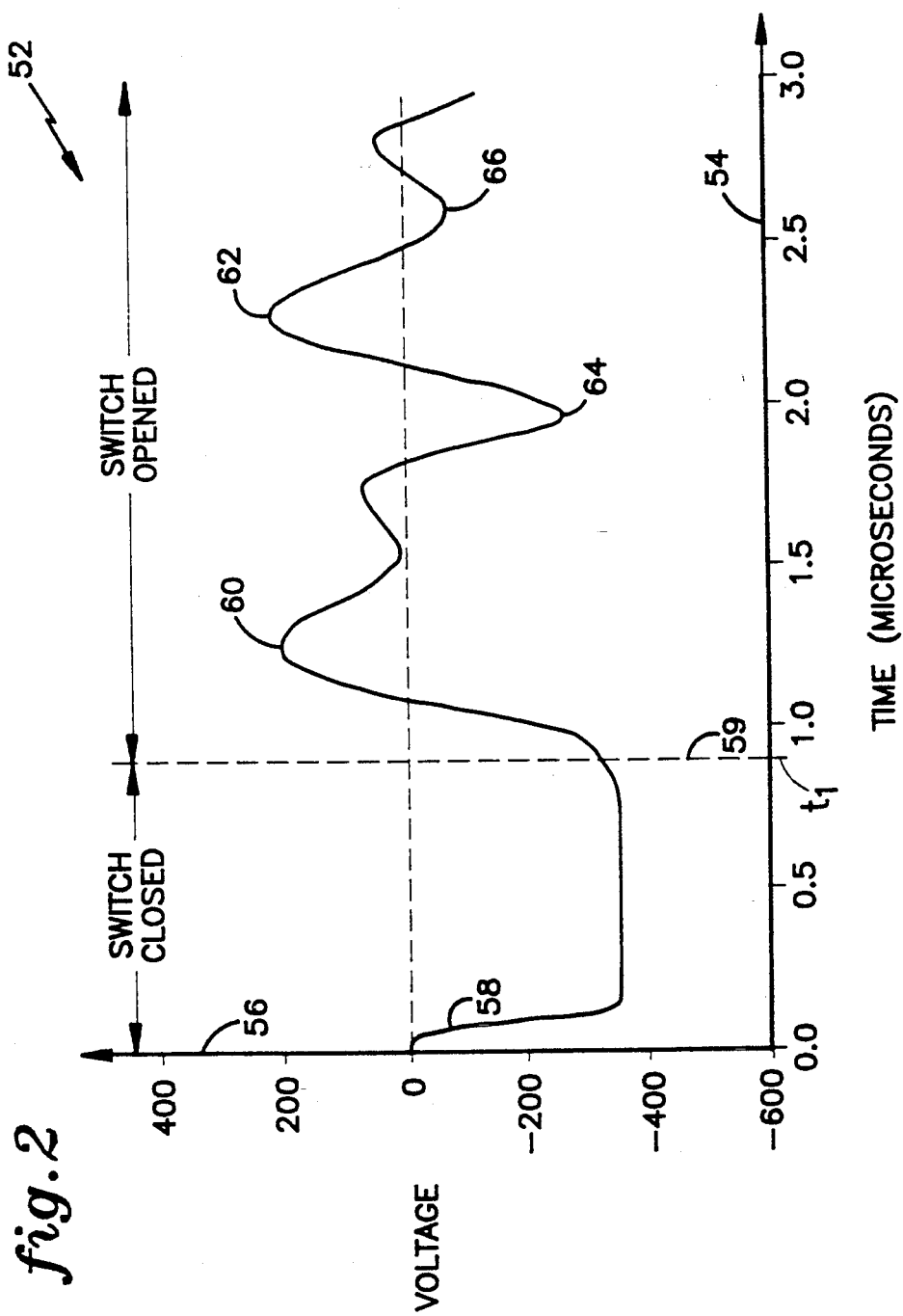
FIG. 2 is an illustration of the voltage applied across the RF tube versus time by the prior art line type modulator of FIG. 1.

FIG. 2 illustrates an experimentally derived plot 52 of voltage applied across the RF tube versus time by the prior art modulator 10. Time is illustrated on a horizontal axis 54, and voltage across the RF tube is illustrated on a vertical axis 56. Referring now to FIGS. 1 and 2, at time equal zero the switch 22 is commanded closed which discharges the energy in the form of a voltage pulse 58 from the PFN into the transformer 34, and ultimately to the RF tube. The energy in the PFN is rapidly discharged, and the pulse ends when the passive elements have discharged sufficiently such that current through the switch stops, and the switch is "opened" at time $t_1$ 59.

A problem with the prior, art modulator of FIG. 1 is the large magnitude, post-pulse voltage oscillations of the voltage pulse 58 even with the energy dissipation provided by the backswing and inverse damping circuits 38,41 respectively. If the magnitude of positive going spikes 60,62 of the voltage pulse 58 become too large, the RF tube's voltage specification may be exceeded and the tube damaged. Similarly, if the magnitude of the voltage pulse's negative going spikes 64,66 become too large, the RF tube may generate noise which degrades the radar receiver's performance.

Figure 3:
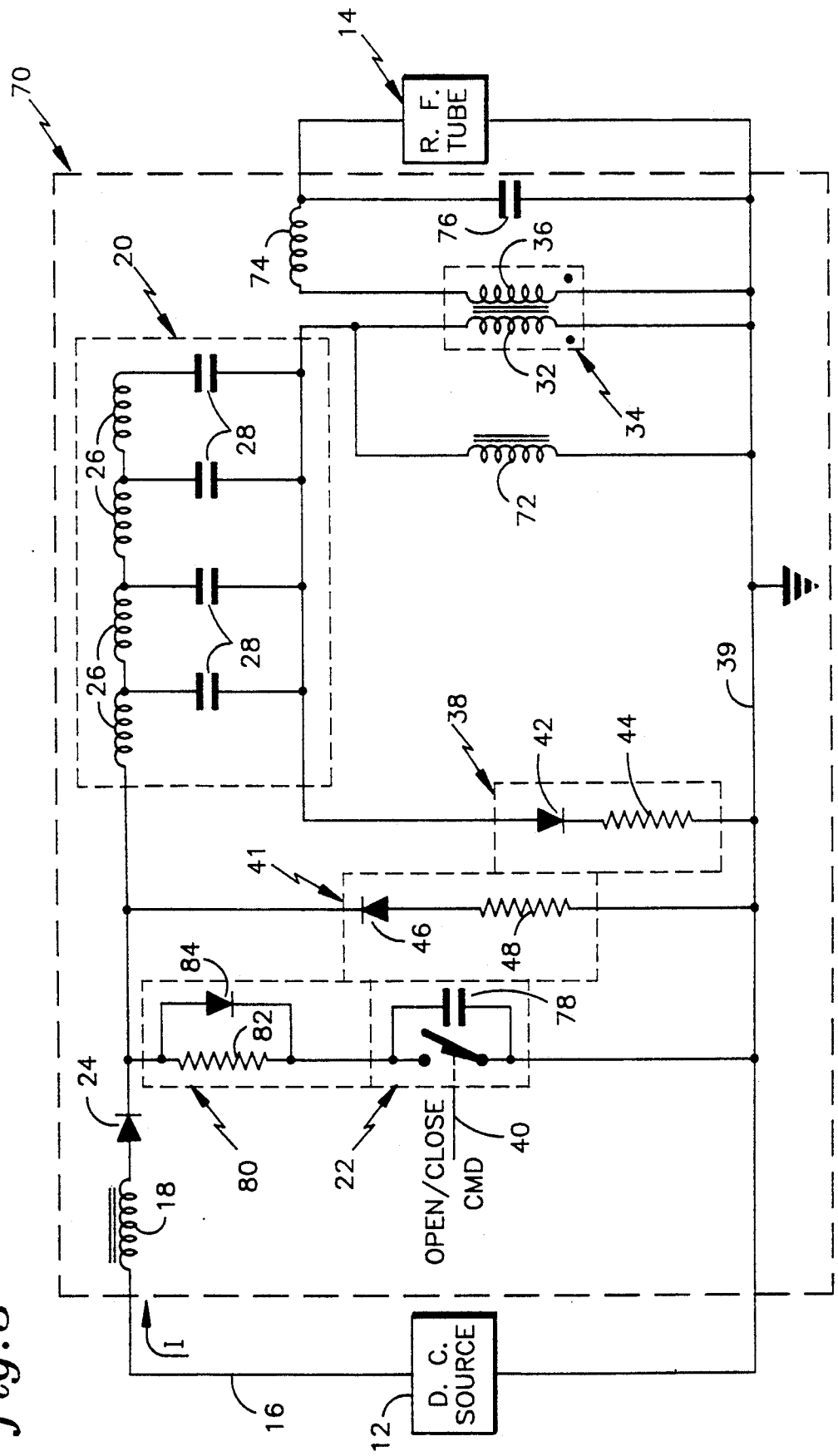
FIG. 3 is a schematic diagram of an improved line type modulator including component representations for the stray capacitance and inductances.

FIG. 3 illustrates an improved line type modulator 70 having improved damping according to the present invention. The improved line type modulator 70 has with a few exceptions a structure similar to the prior art line type modulator 10 of FIG. 1, and therefore the element numbers will be retained wherever possible. FIG. 3 also illustrates for modelling clarity the stray capacitances and inductances inherently associated with non-ideal electrical components. These stray capacitance and inductances are illustrated as components due to the fact that the ideal model of an electrical device is often insufficient to accurately simulate the device in operation. A stray inductance 72 is indicative of the self inductance of the transformer 34, and is connected electrically in parallel with the primary winding 36. A second stray inductance 74 is indicative of the leakage inductance of the transformer and has a lead connected to the RF tube 14 and a stray capacitance 76, and is connected electrically in series with the secondary winding and the RF tube. The stray capacitance 76 is indicative of the stray capacitance primarily associated with imperfections in the transformer and the RF tube, and is modeled electrically parallel to the RF tube. To model the stray capacitance associated with the switch 22, a capacitance 78 is illustrated as electrically parallel to the switch closure. These stray inductances and capacitances are shown to illustrate what the non-ideal circuit would have to be modeled as in order to accurately simulate the operation of the actual circuit. Accordingly it should be understood stray elements 72–78 are not physical circuit components that populate the actual circuit, but instead are used only in the model to represent the stray inductances and capacitances associated with non-ideal electrical devices (e.g., transformer, switch).

The improved modulator 70 according to the present invention includes an additional damping network 80 comprising a resistor 82 and a diode 84 electrically in parallel, both of which are placed in series with the switch 22. The additional damping network 80 dissipates residual energy passing through the stray switch capacitance 78. (Note: if the switch 22 was ideal the capacitance 78 would be zero). The additional damping network 80 also aids in dissipating the residual energy held in the stray RF tube capacitance 76.

FIG. 4 illustrates an experimentally derived plot 86 of voltage applied to the RF tube versus time by the improved modulator 70 illustrated in FIG. 3. Note, even though the stray capacitances and inductances have only been shown in FIG. 3, it should be understood the only difference between the prior art line type modulator 10 of FIG. 1 and the improved modulator of FIG. 3 is the additional damping network 80. Time is illustrated on a horizontal axis 88, and voltage across the RF tube is illustrated on a vertical axis 90. Referring to FIGS. 3 and 4, at time equal zero the switch 22 is commanded closed which initiates the discharge of energy from the PFN 20 to the transformer, and hence to the RF tube. The discharge of the PFN is illustrated by a negative going voltage pulse 92. The energy in the PFN is rapidly discharged, and shortly thereafter at time $t_1$ 94 the switch is opened. The advantage of the additional damping circuit 80 in the improved modulator 70 is illustrated by the behavior of the voltage pulse 92 in FIG. 4.

The magnitude of the post-pulse voltage oscillations of the voltage pulse 92 is far below the backswing voltage magnitude illustrated in FIG. 2. In addition there are no negative voltage pulses in the post-pulse oscillation of the pulse 92. The additional damping network 80 dissipates residual energy within the reactive elements, and clamps the voltage pulse polarity from going negative after the switch is opened.

While the improved damper 80 of the present invention has been illustrated connected between the switch 22 and cathode of the hold-off diode 24, one skilled in the art will recognize that the invention is not so limited, and that as an example, the improved damper may alternatively be placed between the switch and the return line 39. It should be further understood that various other changes may be made to the modulator in order to achieve the desired characteristics for the electrical pulse to the RF tube, such as removing the hold-off diode 24, without departing from the present invention.

The foregoing changes and variations are irrelevant to the invention, it suffices that an improved modulator includes an electrical charging network which limits the rate energy is transferred from a power source into a PFN, and a switch triggers the discharge of stored energy from the PFN into the primary winding of a transformer when the PFN has charged to a predetermined energy level. The primary winding couples the discharged energy to the secondary winding of the transformer providing a pulse of electrical power to an RF power tube that generates a pulse of transmitted electro-magnetic energy. An improved damping network having a diode and resistor electrically in parallel with each other and both in series with the switch is used to reduce the magnitude of the post-pulse voltage oscillations within the modulator.

Although the present invention has been shown and described with respect to a best mode embodiment thereof, it should be understood by those skilled in the art that various other changes, omissions and additions to the form and detail thereof, may be made therein without departing from the spirit and scope of the invention.

I claim:

1. An improved line-type modulator which receives electrical power from a source, and provides a pulse of electrical energy to an R.F. power tube, comprising:
   a charging circuit comprising an inductor having a first lead through which said electrical current from the source is received and a second lead tied to an anode of a hold-off diode through which current flows at a limited rate;
   a pulse forming network having a high side and low side, receives electrical current and charges to a predetermined level of energy with electrical current from said charging circuit received through said high side;
   a pulse transformer having a primary winding coupled to said pulse forming network low side and a secondary winding coupled to the R.F. tube;
   switching means for triggering the discharge of energy stored in said pulse forming network to said transformer when the energy in said pulse forming network reaches the predetermined level;
   an inverse damping circuit having a second resistor and second diode in series, with the cathode of said second diode connected to said high side of said pulse forming network, and a lead of said resistor connected to a return line;
   a backswing damping circuit having a third diode and a third resistor connected in series, with the anode of said third diode connected to said low side of said pulse forming network, and a lead of said third resistor connected to said return line; and
   wherein the improvement comprises,
   a damping network comprising a first diode and a first resistor connected electrically in parallel, and each connected in series with said switching means, such that said damping network reduces the magnitude of the post pulse voltage oscillations in the modulator.

2. The improved line type modulator of claim 1, wherein the anode of said first diode and a first lead of said first resistor are both connected to the cathode of said hold-off diode, and the cathode of said first diode and the second lead of said first resistor are both connected to a first lead of said switching means, and a second lead of said switching means is connected to said return line.

3. The improved line type modulator of claim 1, wherein a first side of said switching means is connected to the cathode of said hold-off diode, and a second side of said switching means is connected to both the anode of said first diode and the first lead of said first resistor, and the cathode of said first diode and the second lead of said first resistor are both connected to said return line.

4. The improved line type modulator of claim 2, wherein said switching means comprises a gas tube switch.

5. The improved line type modulator of claim 2, wherein said switching means comprises a solid state switch.

6. The improved line type modulator of claim 2, wherein said switching means comprises a magnetic core switch.

7. A line type modulator which receives power from an electrical current source and provides a pulse of electrical energy to an RF power tube, comprising:
   an electrical pulse forming network having a high side and a low side;
   a charging circuit comprising an inductor having a first lead through which said inductor receives electrical current from the source, and having a second lead tied to an anode of a hold-off diode through which current flows at a limited rate to charge said pulse forming network connected to the cathode of said hold-off diode, where the impedance of said inductor limits the rate at which energy can be delivered from the source to said pulse forming network high side;
   a pulse transformer which receives electrical energy from said pulse forming network low side and couples the pulse of electrical energy to the RF tube;
   switching means for triggering the discharge of the energy within said PFN to said pulse transformer; and
   a damping circuit comprising a first diode and first resistor connected electrically in parallel with each other, and both in series with said switching means, for dissipating the residual energy associated with the stray capacitance of said switching means and the RF tube to reduce the post pulse voltage oscillations in the modulator;
   an inverse damping circuit having a second resistor and second diode in series, with the cathode of said second diode connected to said high side of said pulse forming network, and a lead of said resistor connected to a return line; and
   a backswing damping circuit having a third diode and a third resistor connected in series, with the anode of said third diode connected to said low side of said pulse forming network, and a lead of said third resistor connected to said return line.

8. The improved line type modulator of claim 7, wherein the anode of said first diode and a first lead of said first resistor are both connected to the cathode of said hold-off diode, and the cathode of said first diode and the second lead of said first resistor are both connected to a first side of said switching means.

9. The improved line type modulator of claim 7, wherein a first side of said switching means is connected to the cathode of said hold-off diode, and a second side of said switching means is connected to the anode of said first diode and a first lead of said first resistor, and the cathode of said first diode and the second lead of said first resistor are both connected to said return line.

10. The improved line type modulator of claim 8, wherein said switching means comprises a gas tube switch.

11. The improved line type modulator of claim 8, wherein said switching means comprises a solid state switch.

12. The improved line type modulator of claim 8, wherein said switching means comprises a magnetic core switch.

* * * * *